United States Patent
Wang et al.

(10) Patent No.: US 10,809,326 B2
(45) Date of Patent: Oct. 20, 2020

(54) GATE DRIVER

(71) Applicant: GE Precision Healthcare LLC, Wauwatosa, WI (US)

(72) Inventors: Ruxi Wang, Cohoes, NY (US); Krishna Mainali, Schenectady, NY (US); Juan Antonio Sabate, Wilton, NY (US); Xiaohu Liu, Newton, MA (US); Fengfeng Tao, Clifton Park, NY (US)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 118 days.

(21) Appl. No.: 15/882,835

(22) Filed: Jan. 29, 2018

(65) Prior Publication Data

US 2019/0235035 A1 Aug. 1, 2019

(51) Int. Cl.

| | |
|---|---|
| *G01R 33/36* | (2006.01) |
| *H02M 3/335* | (2006.01) |
| *H02M 1/08* | (2006.01) |
| *H01F 27/34* | (2006.01) |
| *H03K 17/00* | (2006.01) |
| *G01R 33/385* | (2006.01) |

(Continued)

(52) U.S. Cl.
CPC ..... *G01R 33/3614* (2013.01); *G01R 33/3607* (2013.01); *G01R 33/3852* (2013.01); *H01F 27/346* (2013.01); *H01F 27/42* (2013.01); *H02M 1/08* (2013.01); *H02M 1/083* (2013.01); *H02M 3/33569* (2013.01); *H03K 17/00* (2013.01); *H02M 2001/0006* (2013.01); *H02M 2001/0058* (2013.01)

(58) Field of Classification Search
CPC ............ G01R 33/3614; G01R 33/3607; G01R 33/3852; H01F 27/346; H01F 27/42; H02M 1/08; H02M 1/083; H02M 3/33569; H02M 2001/0006; H02M 2001/0058; H03K 17/00
USPC .......................................................... 324/322
See application file for complete search history.

(56) References Cited

U.S. PATENT DOCUMENTS 6,822,549 B2 * 11/2004 Wolfgram ............. H01F 27/245
                                                                336/182
7,741,734 B2    6/2010 Joannopoulos et al.
(Continued)

FOREIGN PATENT DOCUMENTS

| CN | 104734511 A | * | 6/2015 |
| CN | 104734511 A |   | 6/2015 |
| WO | 2016057804 A1 |   | 4/2016 |

OTHER PUBLICATIONS

Electrical4U, AirCore Transformer, www.electrical4u.com/air-core-transformer. Jan. 2017 (Year: 2017).*

(Continued)

*Primary Examiner* — Patrick Assouad
*Assistant Examiner* — Sean Curtis
(74) *Attorney, Agent, or Firm* — Armstrong Teasdale LLP

(57) ABSTRACT

A gate driver circuit is provided. The gate driver circuit includes an isolated gate driver power supply circuit. The isolated gate driver power supply circuit includes a coreless transformer and a resonance converter coupled to the coreless transformer. A method of manufacturing an isolated gate driver power supply circuit for a gate driver circuit is also provided.

20 Claims, 16 Drawing Sheets

(51) Int. Cl.
  *H01F 27/42* (2006.01)
  *H02M 1/00* (2006.01)

(56) References Cited

U.S. PATENT DOCUMENTS

| | | | | |
|---|---|---|---|---|
| 7,978,041 | B2* | 7/2011 | Bertilsson | H01F 27/2804 |
| | | | | 336/200 |
| 9,712,045 | B2* | 7/2017 | Mao | H02M 1/36 |
| 9,831,782 | B2* | 11/2017 | Barrenscheen | H02M 3/33523 |
| 10,014,781 | B2* | 7/2018 | Bala | H02M 3/22 |
| 10,134,518 | B2* | 11/2018 | Zybura | H01F 19/04 |
| 2001/0035752 | A1 | 11/2001 | Kormos et al. | |
| 2003/0102948 | A1* | 6/2003 | Wolfgram | H01F 27/245 |
| | | | | 336/182 |
| 2004/0189246 | A1 | 9/2004 | Bulai et al. | |
| 2010/0190436 | A1 | 7/2010 | Cook et al. | |
| 2010/0265023 | A1* | 10/2010 | Bertilsson | H01F 27/2804 |
| | | | | 336/200 |
| 2010/0328012 | A1* | 12/2010 | de Rooij | H01F 27/2804 |
| | | | | 336/206 |
| 2011/0291657 | A1 | 12/2011 | Davila et al. | |
| 2012/0044722 | A1* | 2/2012 | Cuk | H02M 3/337 |
| | | | | 363/21.03 |
| 2012/0250382 | A1* | 10/2012 | Frattini | H02M 3/33569 |
| | | | | 363/126 |
| 2013/0281966 | A1* | 10/2013 | Susi | A61M 5/14228 |
| | | | | 604/500 |
| 2013/0335182 | A1* | 12/2013 | Zybura | H01F 19/04 |
| | | | | 336/170 |
| 2014/0077812 | A1* | 3/2014 | Sabate | G01R 33/3852 |
| | | | | 324/319 |
| 2016/0141951 | A1* | 5/2016 | Mao | H02M 1/36 |
| | | | | 363/21.02 |
| 2016/0233775 | A1* | 8/2016 | Barrenscheen | H02M 3/33523 |
| 2019/0235035 | A1* | 8/2019 | Wang | H03K 17/00 |

OTHER PUBLICATIONS

Wayback date for Electrical4U—Air Core Transformer—dated Jan. 18, 2017. (Year: 2019).*
English Google Translation of CN104734511A (Year: 2019).*
Sabate, Juan, et al.; "High-Power High-Fidelity Switching Amplifier Driving Gradient Coils for MRI Systems", Power Electronics Specialists Conference, pp. 261-266, Jun. 2004.
Kelley, Douglas A.C., et al.; "Hardware Considerations in Ultra High Field MRI", Ultra High Field Magnetic Resonance Imaging, pp. 45-57, Dec. 2007.
Winkler, Simone A., et al.; "Gradient and Shim Technologies for Ultra High Field MRI", NeuroImage, 12 pages, Nov. 2016.

* cited by examiner

GATE DRIVER

BACKGROUND

The subject matter disclosed herein relates to a gate driver and, in particular, a gate driver for utilization with a magnetic resonance imaging system.

Typically, magnetic resonance imaging (MM) systems include multiple subsystems spread across different rooms of the medical facility (e.g., equipment room, scan room, control room, etc.). Some of these subsystems include electrical circuitry that utilizes ferrite/magnetic components that, if present in the scan room, may interfere with the magnetic fields in the scan room. However, there is a trend to reduce the footprint of the MRI system and move some of the components into the scan room.

BRIEF DESCRIPTION

Certain embodiments commensurate in scope with the originally claimed subject matter are summarized below. These embodiments are not intended to limit the scope of the claimed subject matter, but rather these embodiments are intended only to provide a summary of possible forms of the present disclosure. Indeed, the disclosed techniques may encompass a variety of forms that may be similar to or different from the embodiments set forth below.

In accordance with a first embodiment, a gate driver circuit is provided. The gate driver circuit includes an isolated gate driver power supply circuit. The isolated gate driver power supply circuit includes a coreless transformer and a resonance converter coupled to the coreless transformer.

In accordance with a second embodiment, a gradient driver system for a magnetic resonance imaging system is provided. The gradient driver system includes a gate driver circuit. The gate driver circuit includes an isolated gate driver power supply circuit. The isolated gate driver power supply circuit includes an air core transformer including multiple windings magnetically coupled together. The isolated gate driver power supply circuit also includes a resonance converter coupled to the air core transformer. The resonance converter is configured to compensate for leakage inductance of the air core transformer.

In accordance with a third embodiment, a method of manufacturing an isolated gate driver power supply circuit for a gate driver circuit is provided. The method includes coupling a coreless transformer to a resonance converter, wherein the coreless transformer includes a primary winding and a secondary winding linked by an interlink wire. The method also includes coupling a power supply to the coreless transformer. The method further includes coupling a rectifier to the resonance converter.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time-consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

The present disclosure is directed to a gate driver (e.g., as part of a gradient driver system) that can be reliably and safely utilized in a scan room for a magnetic resonance imaging (MM) system without affecting image quality. The gate driver includes an isolated gate driver power supply circuit that includes a coreless transformer (e.g., air core transformer). Thus, the gate driver does not include any ferromagnetic material and is compatible with MM functional frequencies. In certain embodiments, the coreless transformer includes a primary winding and a secondary winding in concentric arrangement to provide an acceptable magnetic coupling, sufficient insulation, and minimum susceptibility to switch voltage changing rate (dv/dt). In certain embodiments, the isolated gate driver power supply circuit may include a resonance converter coupled to the coreless transformer to compensate for leakage inductance and generate an output voltage independent of load. The isolated gate driver power supply circuit may be more effective at reducing conducted and radiated interference due to soft switching and resonant operation with a stable and synchronized operation. Overall, the gate driver provides high power efficiency and load insensitivity at lower cost.

Figure 1:
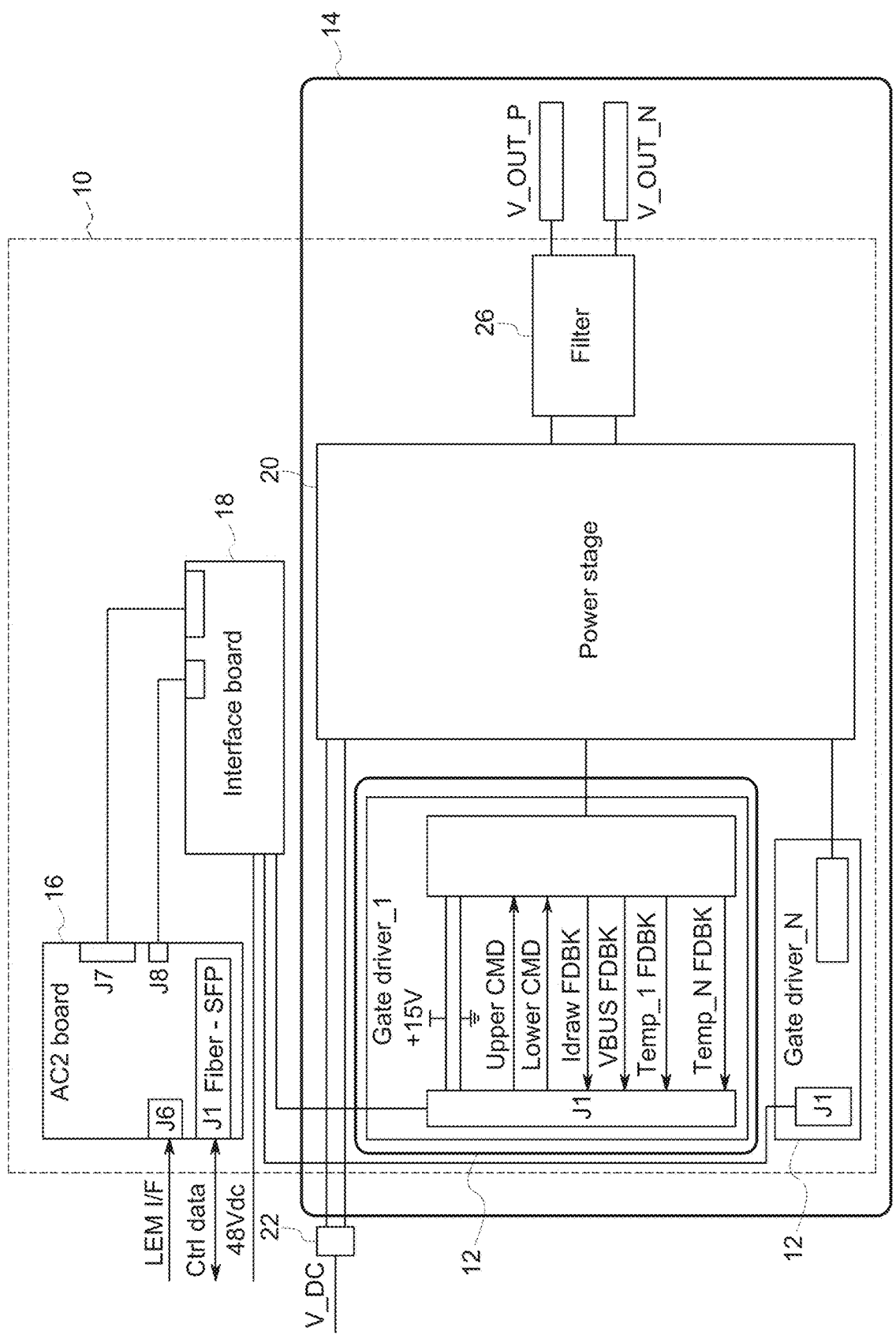
FIG. 1 is a schematic diagram of an embodiment of a gradient driver system with gate drivers disposed within a scan room.

FIG. 1 is a schematic diagram of an embodiment of a gradient driver (e.g., gradient amplifier) system 10 with gate drivers 12 disposed within a scan room 14. The gradient driver system 10 includes a controller or control board 16 coupled to multiple gate drivers 12 via an interface board 18. The gate drivers 12 are electronic circuits coupling the control electronics (e.g., controller 16) to power semiconductor devices to enable control functions such as turning on/off the power devices. As described, in greater detail below, the gate drivers 12 each include an isolated gate power supply that includes a coreless transformer (e.g., air core transformer). The gate drivers 12 are coupled to a power stage 20. The power stage 20 includes power semiconductor devices (e.g., metal-oxide-semiconductor field effect transistor (MOSFET), insulated-gate bipolar transistor (IGBT), or other semiconductor power devices). The number of gate drivers 12 coupled to the power stage 20 to control switching of the semiconductor power devices may vary. In addition, a direct current (DC) power supply 22 is coupled to the power stage 20. The power stage is 20 coupled to a filter 26 (e.g., power filter) that filters the power line to remove ripple signals. As depicted, due their structure, the gate drivers 12 are located within the scan room 14 along with the power stage 20 and filter 26. The gate drivers 12 are configured to be utilized reliably and safely in presence of a high magnetic field within the scan room.

Figure 2:
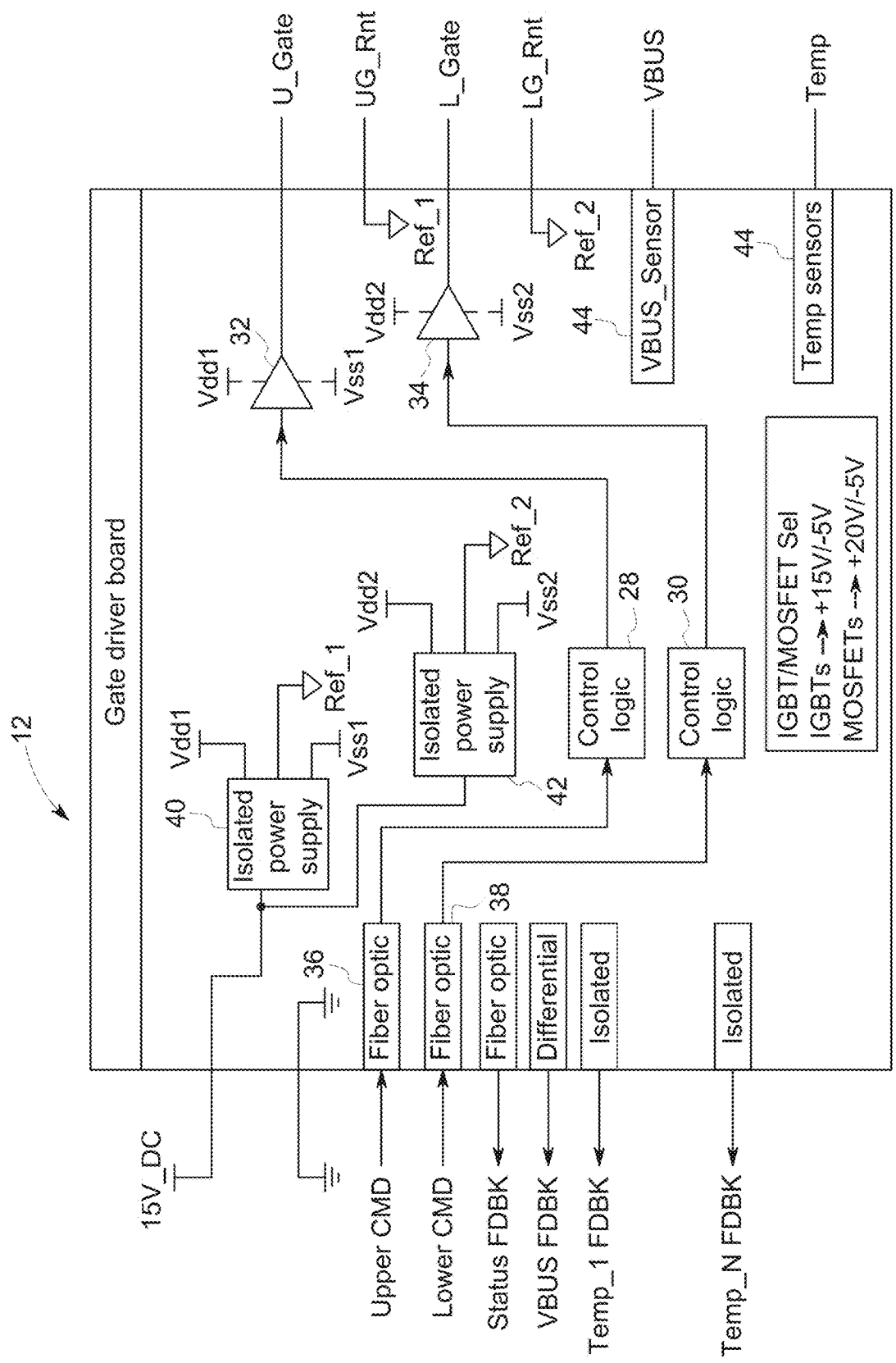
FIG. 2 is a block diagram of an embodiment of a gate driver in FIG. 1.

FIG. 2 is a block diagram of an embodiment of the gate driver 12 (or gate driver board) in FIG. 1. The gate driver 12 includes control logic 28, 30 coupled to the drivers 32, 34 for controlling the upper and lower gates, respectively, of the upper and lower power semiconductor devices to turn the devices on and off. The control logic 28, 30 are coupled to the fiber optics 36, 38, respectively. The gate driver 12 also includes isolated power supplies (e.g., isolated gate power supplies) 40, 42 that provide the voltage level (e.g., secondary voltages) for the control logic and power to drive (e.g., to charge and discharge) the gate of the power semiconductor device. The power supplies 40, 42 are high voltage isolated to avoid short circuit of the power stage. As depicted, the gate driver 12 may include sensors 44 (e.g., temperature sensors, VBUS sensor, etc.) and provide feedback to the controller 16 via fiber optics, isolated lines, differential lines, or other means.

Figure 3:
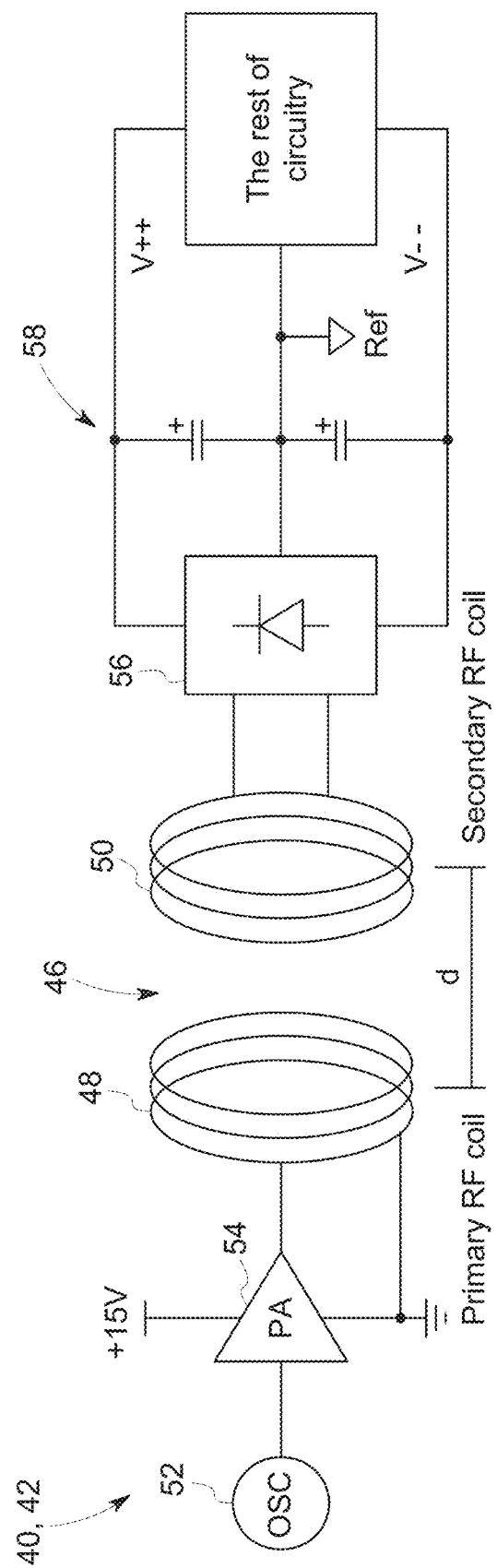
FIG. 3 is a schematic diagram of an embodiment of the isolated power supply of FIG. 2.

FIG. 3 is a schematic diagram of an embodiment of the isolated power supply 40, 42 of FIG. 2. As depicted, each isolated power supply 40, 42 includes a coreless transformer 46 (e.g., air core transformer) lacking ferromagnetic material that includes a first coil 48 (e.g., primary radiofrequency (RF) coil) magnetically coupled (e.g., inductively coupled) to a second coil 50 (e.g., secondary RF coil). In certain embodiments, the transformer 46 may include a different number of windings or coils. As disclosed below, the coils 48, 50 may be concentrically arranged to provide an acceptable magnetic coupling, sufficient insulation, and minimum susceptibility to switch voltage changing rate (dv/dt). As depicted, the transformer 46 (in particular, coil 48) is coupled to an oscillator 52 and a power amplifier 54. The oscillator 52 converts the power from DC to AC. The power amplifier 54 amplifies the power that is provided to the load. As depicted, the transformer 46 is coupled to a rectifier 56 and additional circuitry 58. The rectifier 56 converts AC to DC.

Figure 4:
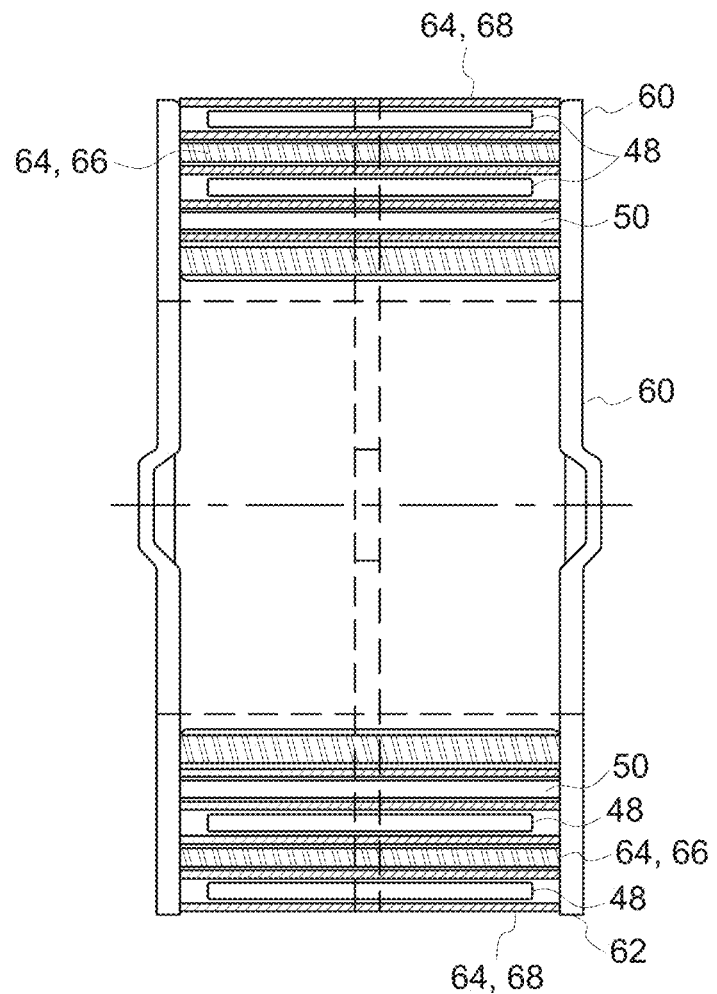
FIG. 4 is a schematic diagram of an embodiment of an air core transformer.

FIG. 4 is a schematic diagram of an embodiment of the air core transformer 46. As depicted, the coils 48, 50 (e.g., litz wire) are wound on a single body 60 (e.g., plastic bobbin) and magnetically coupled together. In certain embodiments, the coils 48, 50 may be wound on separate bodies and then coupled together. The coils 48, 50 are disposed in a concentric arrangement with a portion of coil 48 being disposed within coil 50. The concentric arrangement improves the coupling between the coils 48, 50. Two different layers of the coils 48, 50 are disposed on the ends 60, 62 of the body 60. The number of turns of each of the coils 48, 50 may vary. As depicted, insulation 64 of different thickness is disposed between the coils 48, 50. The insulation 64 may include insulation paper 66 and insulation film 68 (e.g., polyimide film).

Figure 5:
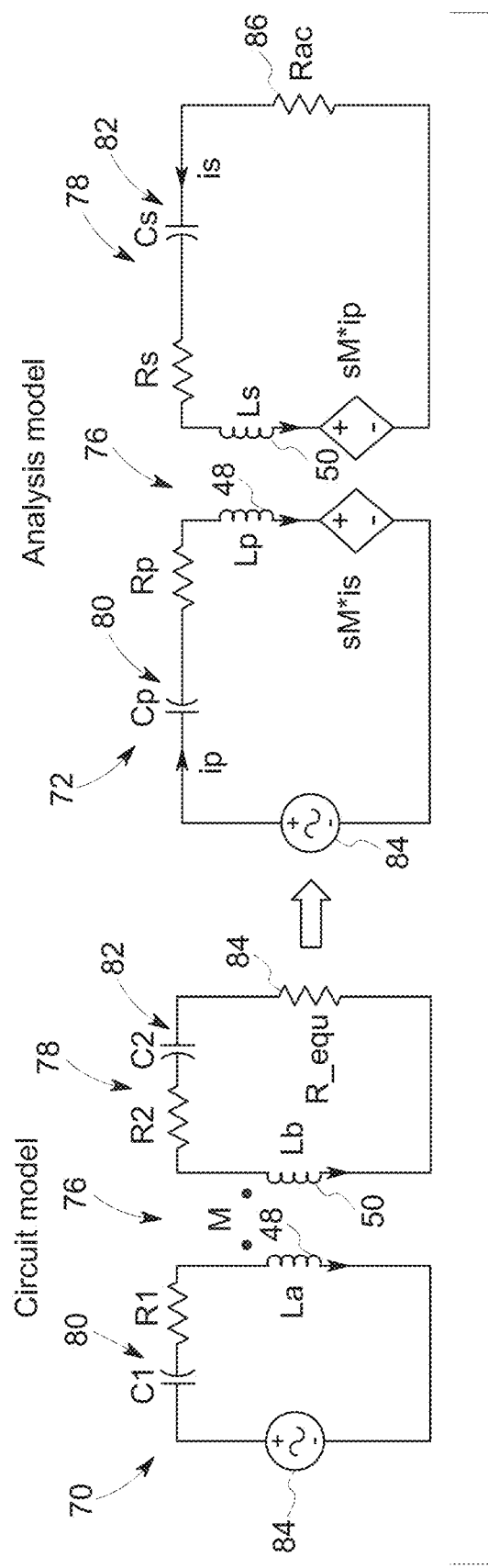
FIG. 5 is a schematic diagram of an embodiment of a circuit model and an analysis model for an air core transformer with resonance.

To reduce the effect of leakage inductance on the load regulation, the transformer 46 is provided with resonance. FIG. 5 is a schematic diagram of an embodiment of a circuit model 70 and an analysis model 72 for an air core transformer 76 with resonance. As depicted, $L_a$ and $L_p$ represent the first and second coils 48, 50, respectively. As depicted, the transformer 76 is coupled to a resonance converter 78 (e.g., resonance inverter). In particular, the resonance converter 78 includes a respective capacitor 80, 82 coupled in series with the coils 48, 50. For example, capacitor 80 (C1 and $C_p$) is coupled in series with coil 48 and capacitor 82 (C2 and $C_s$) is coupled in series with coil 50. The capacitors 80, 82 compensate for leakage inductance. The transformer 76 is coupled to the AC power source 84. The models 70, 72 represent the resistance of the coils 48, 50 as R1 and $R_p$ for coil 48 and R2 and $R_s$ for coil 50, respectively.

In addition, the resonance converter 78 tunes the transformer 76 to operate at a frequency where the output is a fixed voltage free of the load (represented by numeral 84). In other words, the transformer 76 is output voltage insensitive (e.g., does affect voltage gain). For example, for the voltage gain ($G_v$) of the transformer in the models 70, 72 shown in equation 1 it is desirable to have the difference in the switching frequencies $\Delta(\omega)$ to equal 0 (i.e., not affect voltage gain):

$$G_v(\omega, R_{ac}) = \cfrac{1}{\cfrac{Z_p(\omega)}{\omega \cdot M_{ps}} + \cfrac{\Delta(\omega)}{\omega^3 \cdot M_{ps} \cdot C_p \cdot C_s \cdot R_{ac}}} \quad (1)$$

where $$\Delta(\omega) = \omega^4 \cdot L_p \cdot C_p \cdot L_s \cdot C_s \cdot (k_{ps}^2 - 1) + \omega^2 \cdot (L_p \cdot C_p + L_s \cdot C_s) - 1 \quad (2)$$

$$Z_p(\omega) = R_p + i \cdot X_p \omega \quad (3)$$

and $$X_p \omega = \omega \cdot L_p - \frac{1}{\omega \cdot C_p}. \quad (4)$$

The equations for determining frequencies, $\omega_L$ and $\omega_H$ for achieving $\Delta(\omega) = 0$ are:

$$\omega_L = \sqrt{\frac{\omega_p^2 + \omega_s^2 - \sqrt{(\omega_p^2 + \omega_s^2)^2 - 4 \cdot (1 - k_{ps}^2) \cdot \omega_p^2 \cdot \omega_s^2}}{2 \cdot (1 - k_{ps}^2)}} \quad (5)$$

and $$\omega_H = \sqrt{\frac{\omega_p^2 + \omega_s^2 - \sqrt{(\omega_p^2 + \omega_s^2)^2 - 4 \cdot (1 - k_{ps}^2) \cdot \omega_p^2 \cdot \omega_s^2}}{2 \cdot (1 - k_{ps}^2)}}. \quad (6)$$

Figure 6:
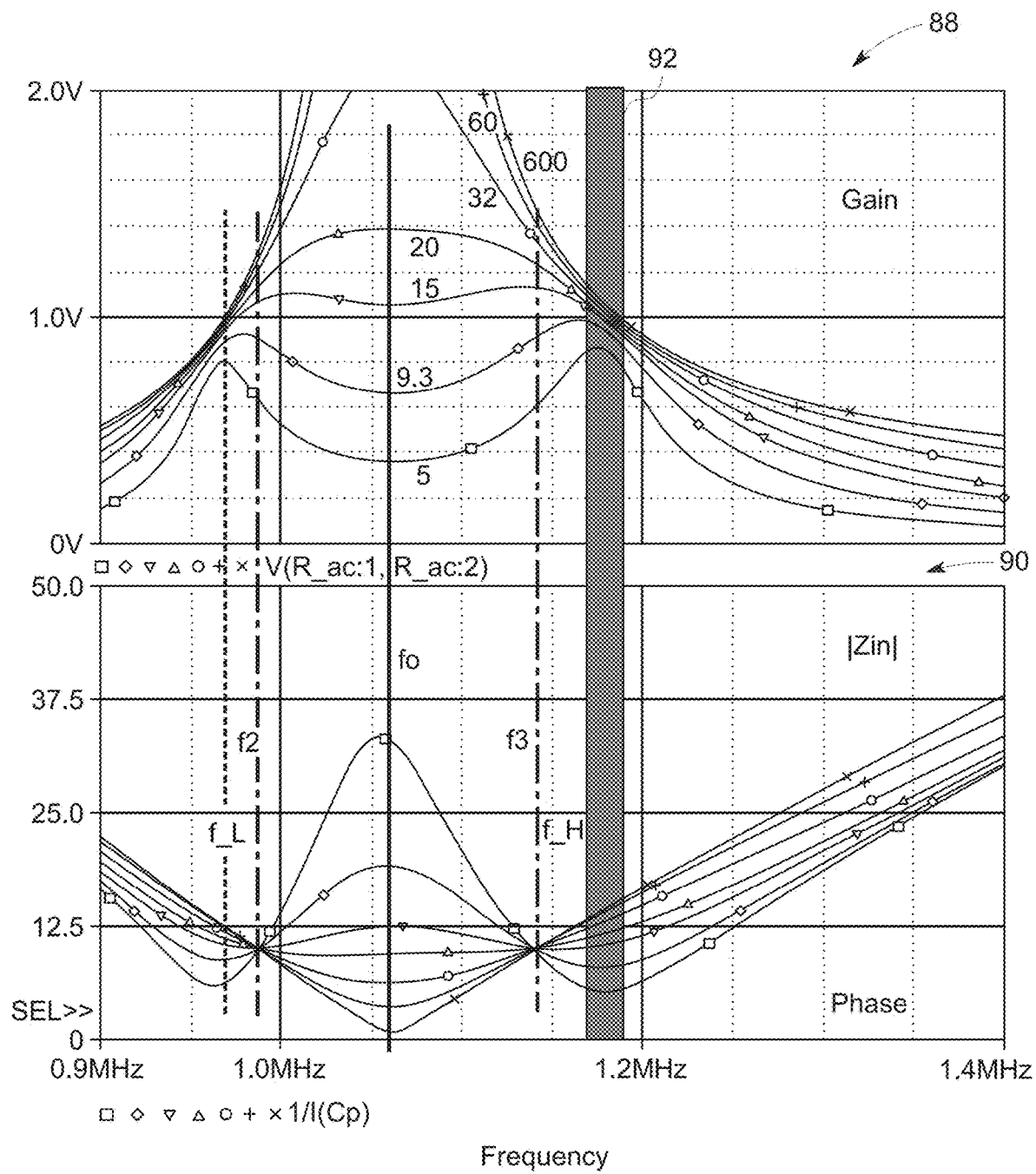
FIG. 6 is a graphical representation of a gain curve and input impedance curve for the air core transformer of FIG. 5.

In the above equations, $M_{ps}$ represents the mutual inductance between the coils 48, 50, $L_p$ and $L_s$ represent the respective inductance of the coils 48, 50, $C_p$ and $C_s$ represent the respective capacitance of the coils 48, 50, $R_{ac}$ represents the overall resistance, $R_p(\omega)$ represents the resistance of coil 48, $X_p$ represents the reactance at a given frequency, $Z_p(\omega)$ represents the impedance of coil 48 at a given frequency, and $k_{ps}$ represents the coupling coefficient between the coils 48, 50. FIG. 6 illustrates how the fixed frequency (e.g., resonance frequency) is chosen for the resonant converter 78 to tune the transformer 76. FIG. 6 is a graphical representation of a gain curve 88 and input impedance curve 90 for the air core transformer 76 of FIG. 5. The resonance frequency 92 (in this case f_H, where f_H=$\omega_H$/2$\pi$) is selected at a frequency where the gain curves converge together so that the output is a fixed voltage of the load. As noted above, operating at the resonance frequency 92, the transformer 70 (and the isolated gate driver power supply) would have an output voltage insensitive to load variation. This enables the gate driver power supply in conjunction with the transformer 76 with resonance to utilize zero voltage switching and, thus, soft switching to minimize switching losses and to reduce conducted and radiated interference with the MRI system while providing stable and synchronized operation. Any variations in voltage may be compensated for via a linear regulator.

Figure 7:
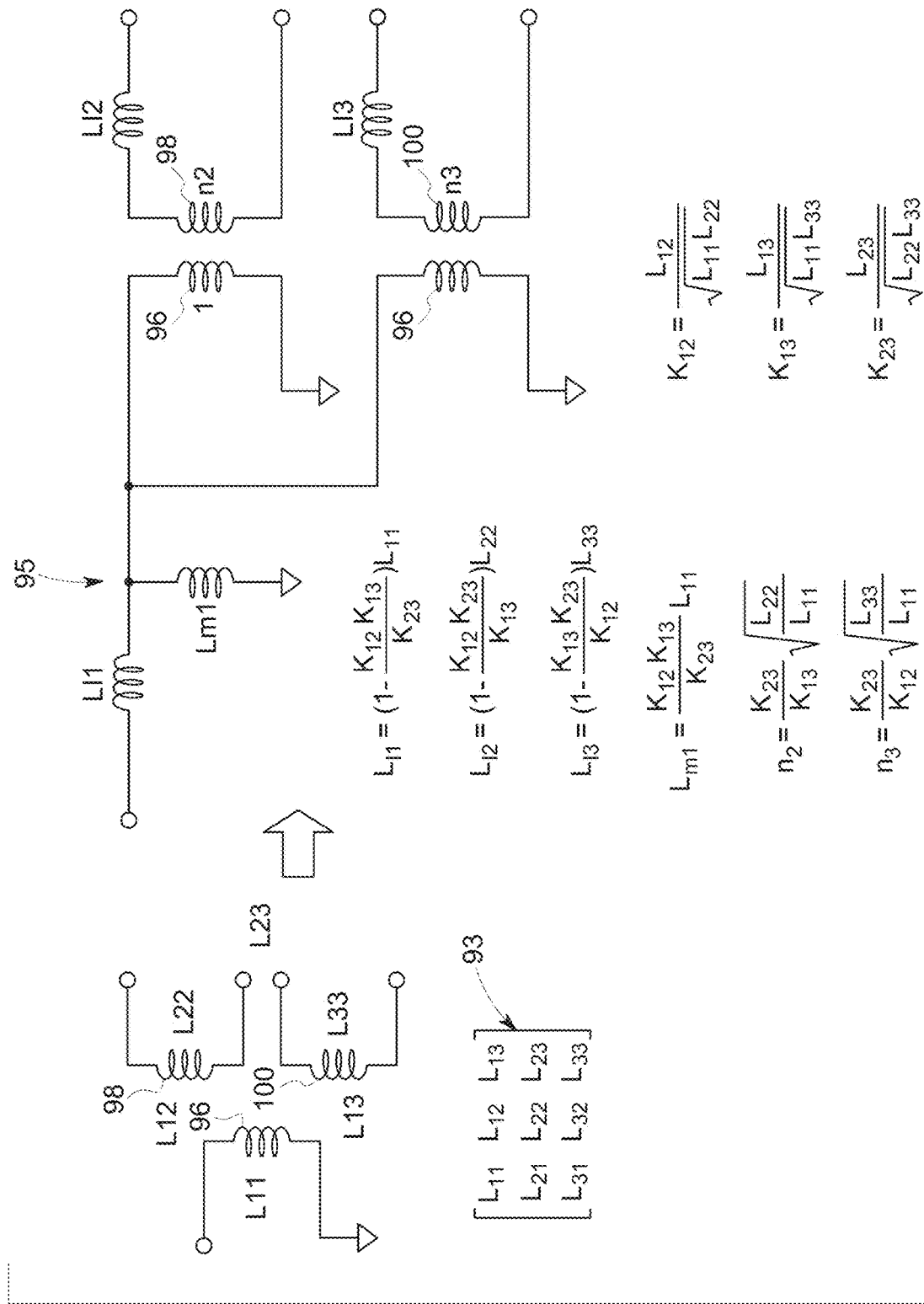
FIG. 7 is a schematic diagram of an embodiment of an air core transformer with three windings and modeling.

In certain embodiments, the air core transformer may include more than two windings or coils. FIG. 7 is a schematic diagram of an air core transformer 94 with three windings and its modeling. FIG. 7 depicts the transformer 94, inductance matrix 93, and model 95 of the transformer 94. In particular, the transformer 94 includes a primary winding or coil 96, secondary winding or coil 98, and tertiary winding or coil 100. The respective inductances for and between the coils 96, 98, 100 are represented by $L_{11}$, $L_{12}$, $L_{13}$, $L_{22}$, $L_{23}$, and $L_{33}$. The leakage inductance of coils 96, 98, and 100 are represented by $L_{l1}$, $L_{l2}$, and $L_{l3}$, respectively. The magnetization inductance of coil 96 is represented by $L_{m1}$. The coupling coefficients between the coils are represented by $K_{12}$, $K_{13}$, and $K_{23}$. In other embodiments, the transformer 94 may include a different number of coils or windings.

Figure 8:
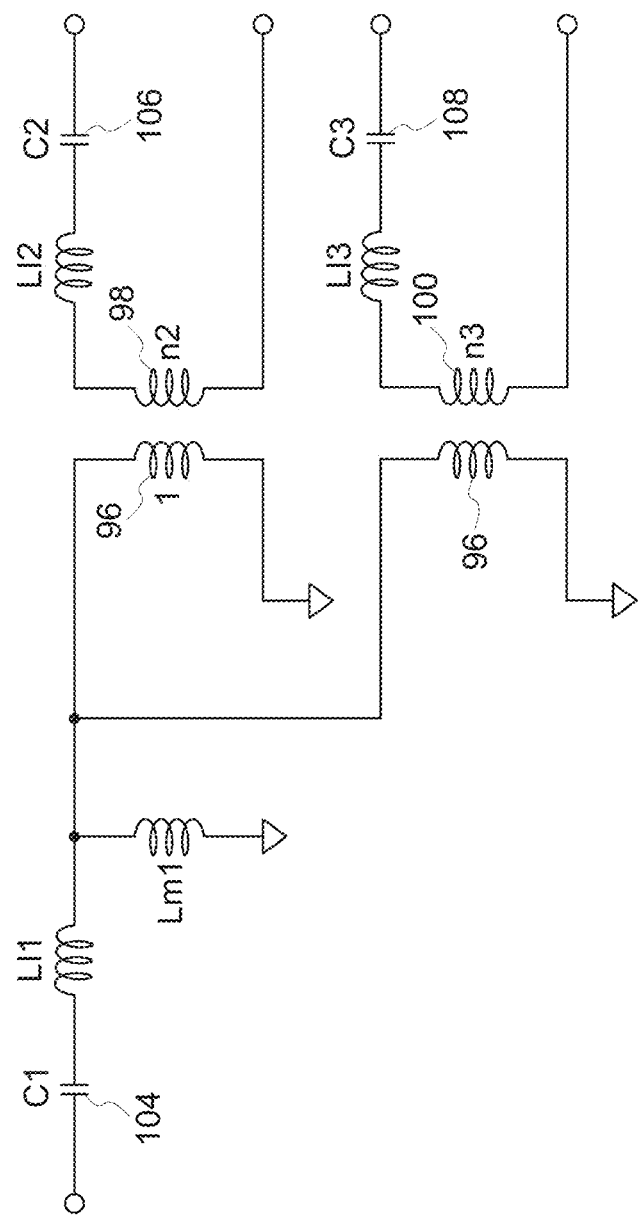
FIG. 8 is a schematic diagram of an embodiment of the air core transformer of the FIG. 7 with resonance.

As mentioned above, the air core transformer may include resonance. FIG. 8 is a schematic diagram of the air core transformer 94 of the FIG. 7 with resonance. As depicted, the transformer 94 is coupled to a resonance converter 102 (e.g., resonance inverter). In particular, the resonance converter 102 includes a respective capacitor 104, 106, 108 coupled in series with the coils 96, 98, 100. For example, capacitor 104 (C1) is coupled in series with coil 96, capacitor 106 (C2) is coupled in series with coil 98, and capacitor 108 (C3) is coupled in series with coil 100. The capacitors 104, 106, 108 compensate for leakage inductance. In addition, the resonance converter 102 tunes the transformer 94 to operate at a frequency where the output is a fixed voltage free of the load. This enables the gate driver power supply in conjunction with the transformer 94 with resonance to utilize zero voltage switching and, thus, soft switching to minimize switching losses and to reduce conducted and radiated interference with the Mill system while providing stable and synchronized operation.

Figure 9:
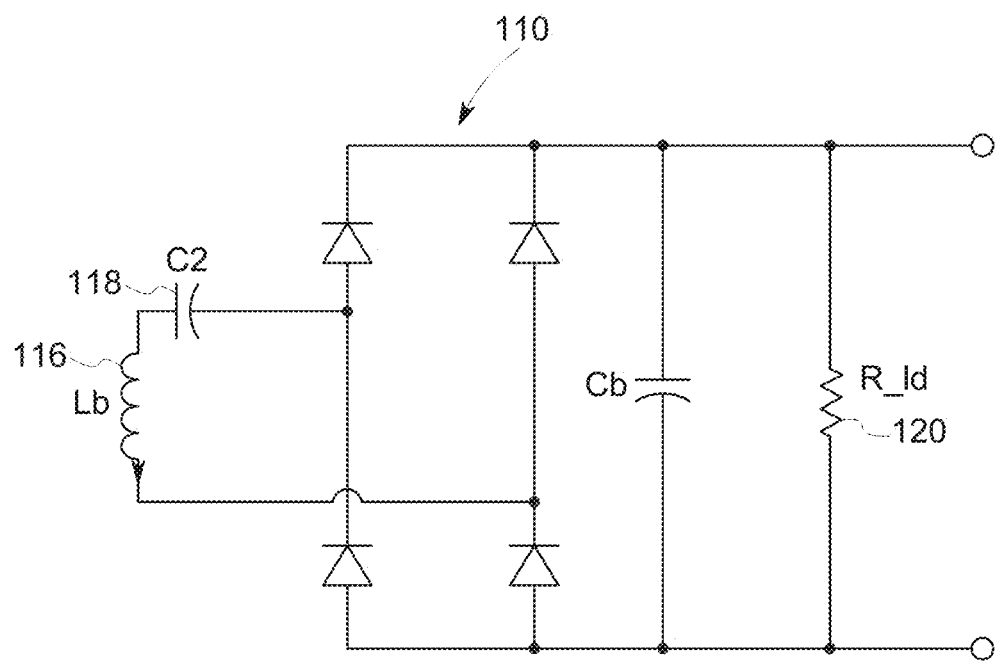
FIG. 9 is a schematic diagram of an embodiment of a rectifier of an isolated power supply (e.g., full bridge rectifier)
Figure 10:
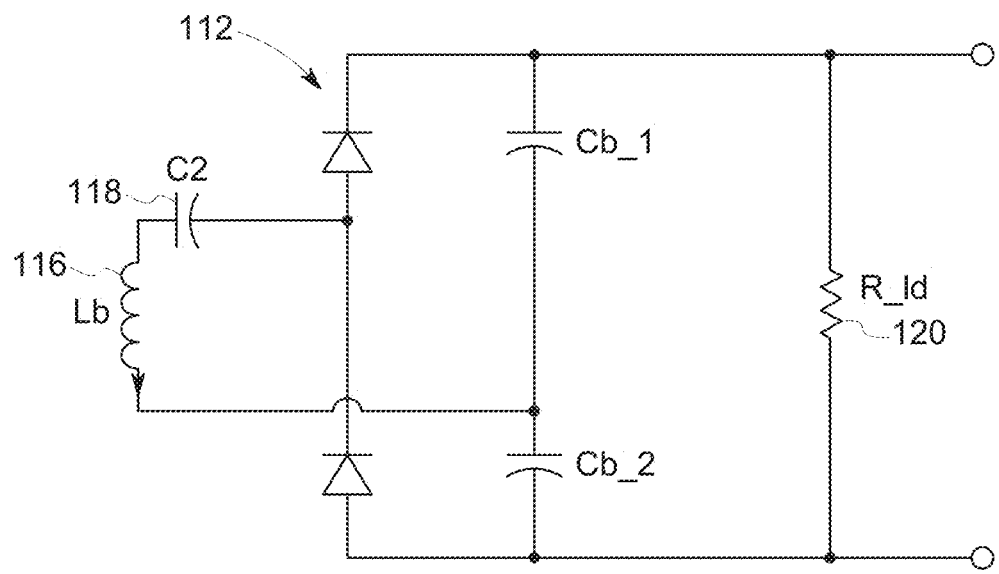
FIG. 10 is a schematic diagram of an embodiment of a rectifier of an isolated power supply (e.g., half-bridge rectifier)
Figure 11:
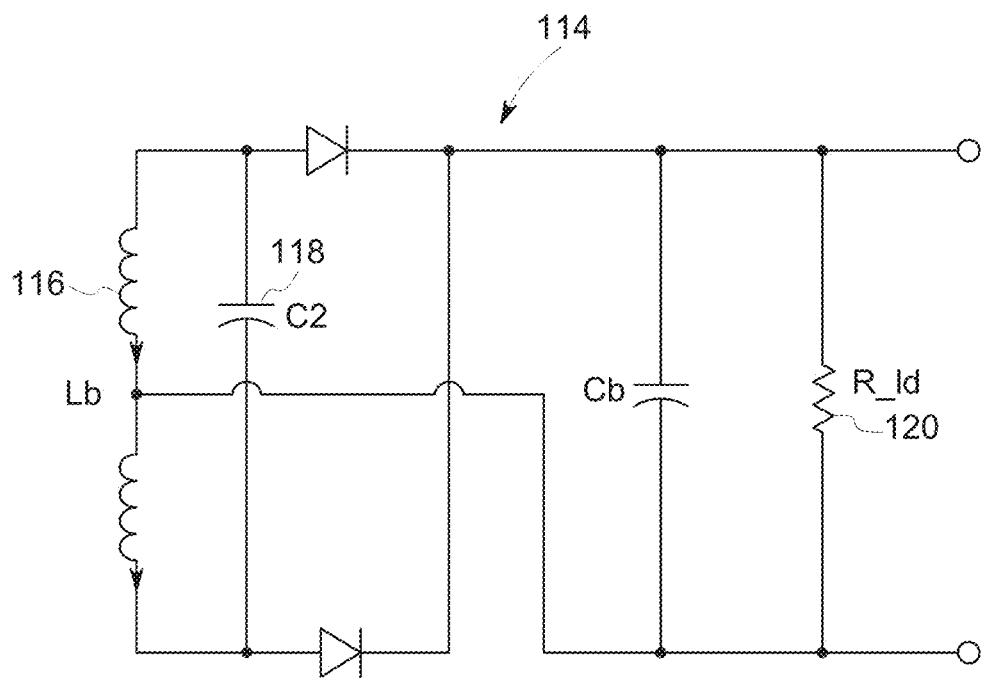
FIG. 11 is a schematic diagram of an embodiment of a rectifier of an isolated power supply (e.g., center-tap rectifier)
Figure 12:
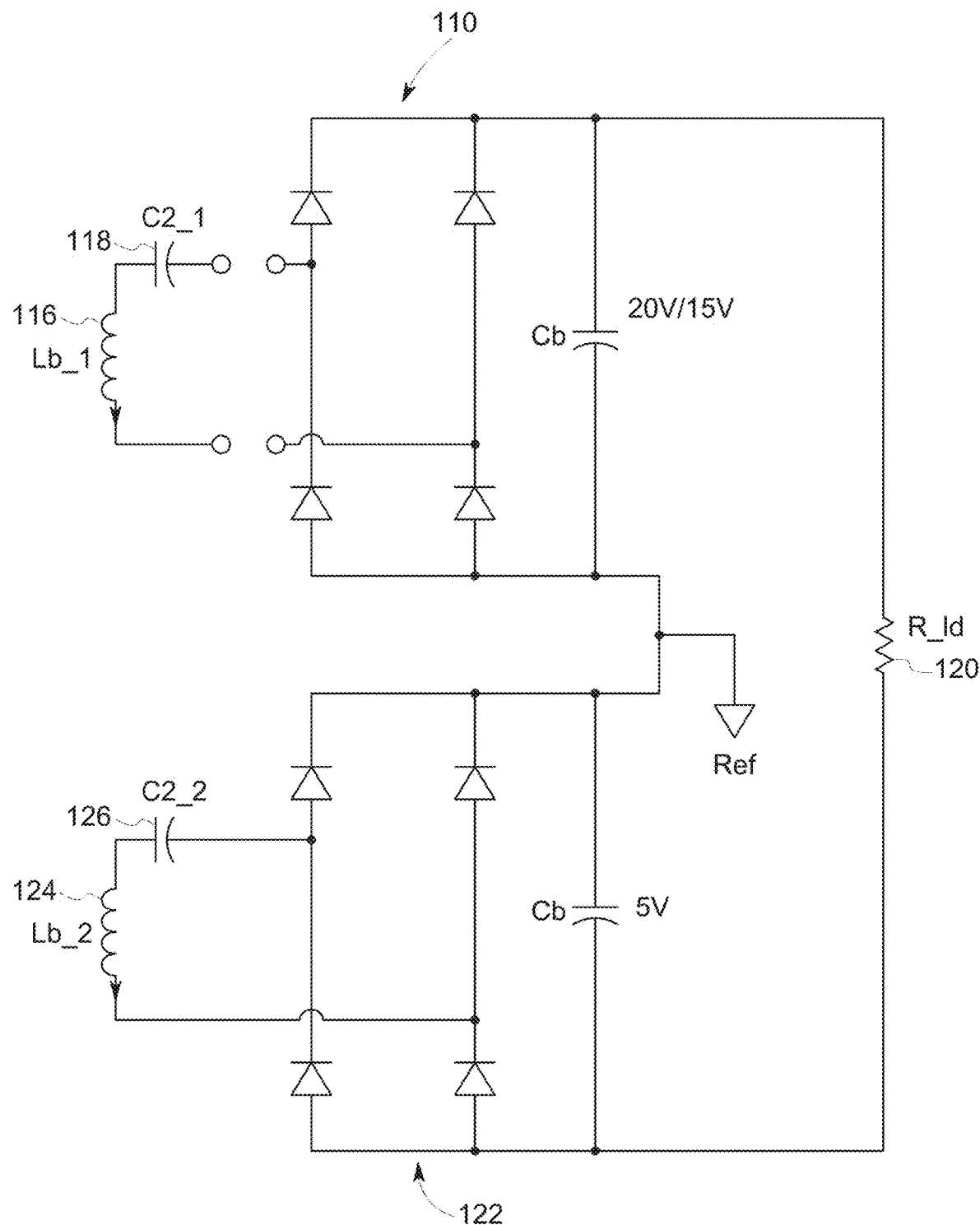
FIG. 12 is a schematic diagram of an embodiment of a rectifier of an isolated power supply (e.g., two full bridge rectifiers coupled to respective windings)

The isolated power supplies 40, 42 of FIG. 2 may also each include a rectifier to convert AC to DC and output the power from the power supplies 40, 42. FIGS. 9-12 are schematic diagrams of rectifiers. FIGS. 9, 10, and 11 illustrate a full bridge rectifier 110, half-bridge rectifier 112, and a center-tap rectifier 114 coupled to a coil or winding 116 (e.g., secondary winding) of an air core transformer. As depicted, the winding 116 is coupled in series with a capacitor 118 (C2) of a resonance converter. The rectifiers 110, 112, 114 are coupled to equivalent load resistance 120 (R_ld). FIG. 12 illustrates a respective full bridge rectifier 110, 122 coupled to a respective coil or winding of an air core transformer. For example, the winding 116 (e.g., secondary winding) is coupled to full bridge rectifier 110 and the winding 124 (e.g., tertiary winding) is coupled to full bridge rectifier 122. In FIG. 12, windings 116, 124 are each coupled in series with a capacitor 118, 126 of a resonance converter. As depicted, the rectifiers 116, 122 are coupled to equivalent load resistance 120 (R_ld).

Figure 13:
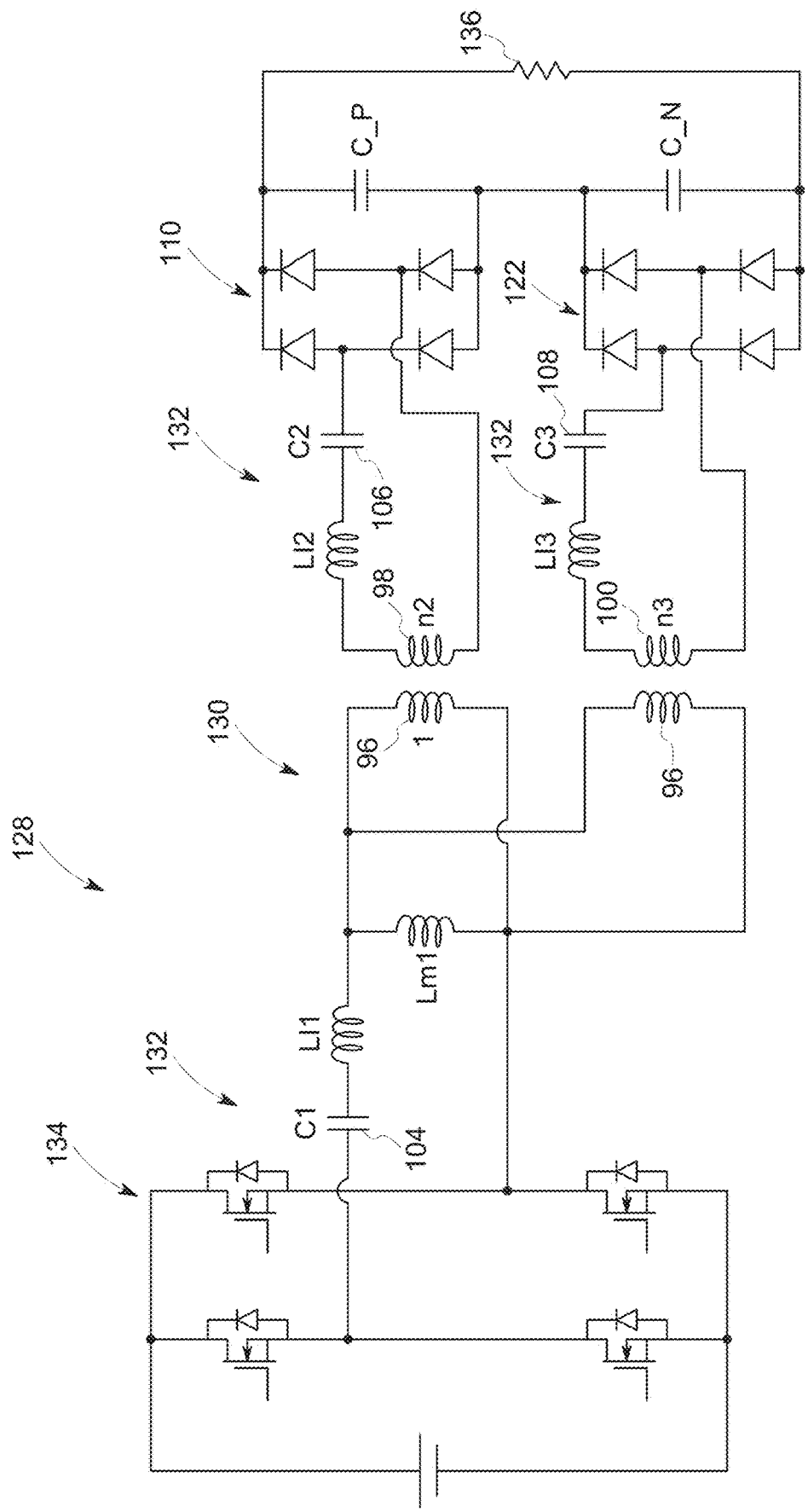
FIG. 13 is a schematic diagram of an embodiment of an isolated gate driver power supply.

FIG. 13 is a schematic diagram of an embodiment of an isolated gate driver power supply 128 for a gate driver. The isolated gate driver power supply 128 includes an air core transformer 130 coupled to a resonance converter 132 (e.g., resonance inverter). In particular, the air core transformer includes three coils or windings 96, 98, 100 coupled in series with capacitors 104 (C1), 106 (C2), 108 (C3), respectively, of the resonance converter 132. Windings 96, 98, 100 function as the primary, secondary, and tertiary windings, respectively. As described above, the resonance converter 132 provides tuning for the transformer 130 to compensate for leakage inductance. A full bridge circuit 134 is coupled to and provides AC power to the transformer 130. Full bridge rectifiers 110, 122 are coupled to windings 98, 100, respectively. The rectifiers 110, 122 convert AC to DC and provide the power to load 136.

Figure 14:
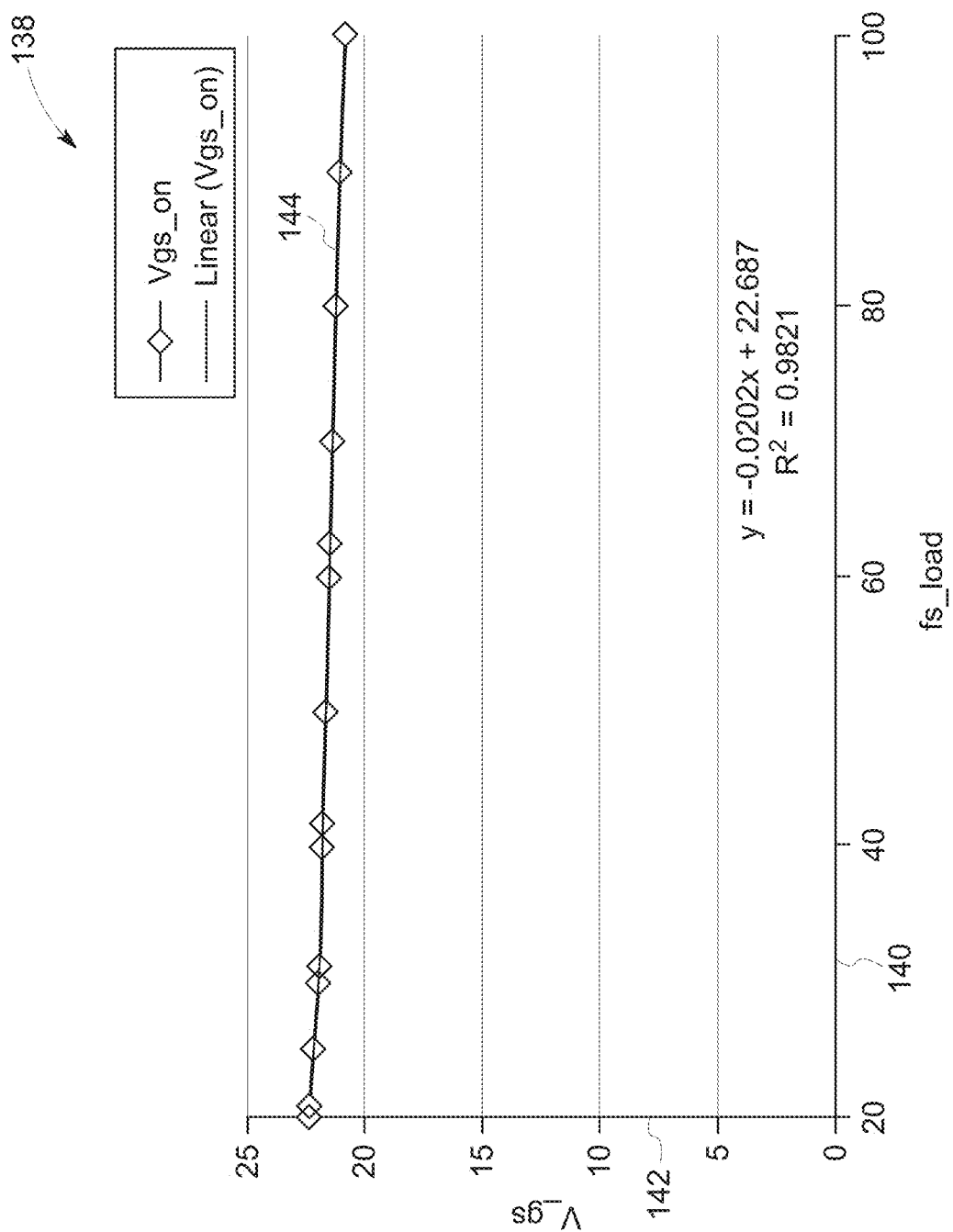
FIG. 14 is a graphical representation of gate voltage versus load for an isolated gate driver power supply.

FIG. 14 is a graphical representation 138 of gate voltage versus load for an isolated gate driver power supply (e.g., as shown in FIG. 13). The x-axis 140 and the y-axis 142 represent the load and gate voltage, respectively. The graphical representation 138 illustrates that as the load illustrates the gate voltage output of the isolated gate driver power supply remains relatively consistent (e.g., with an efficiency of 80 percent or greater) as shown by plot 144. In other words, the voltage drop is minimal for the isolated gate driver power supply as the load increases.

As mentioned above, with the utilization of the air core transformer, it is desirable to increase the coupling coefficient while reducing the capacitance coupling between the primary and secondary windings. FIGS. 15-21 provide alternative embodiments for both increasing the coupling coefficient and reducing capacitance coupling. These embodiments disclose different techniques for fixing an interlink winding position between the primary winding (e.g., primary side) and the secondary winding (e.g., secondary side) of the transformer.

Figure 15:
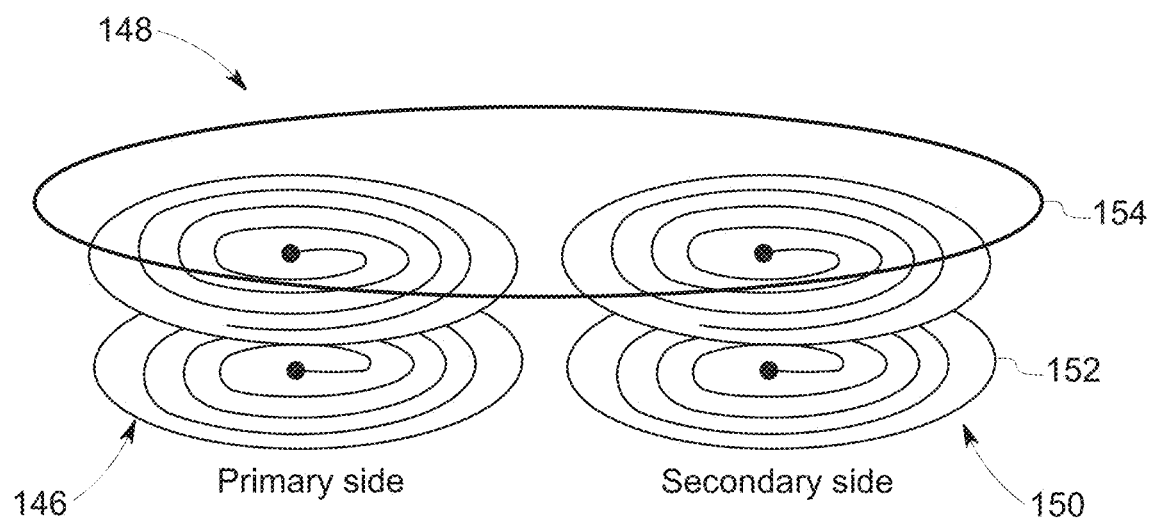
FIG. 15 is a schematic diagram of an embodiment of an air core transformer with the windings (e.g., spiral shape) integrated into a printed circuit board.
Figure 16:
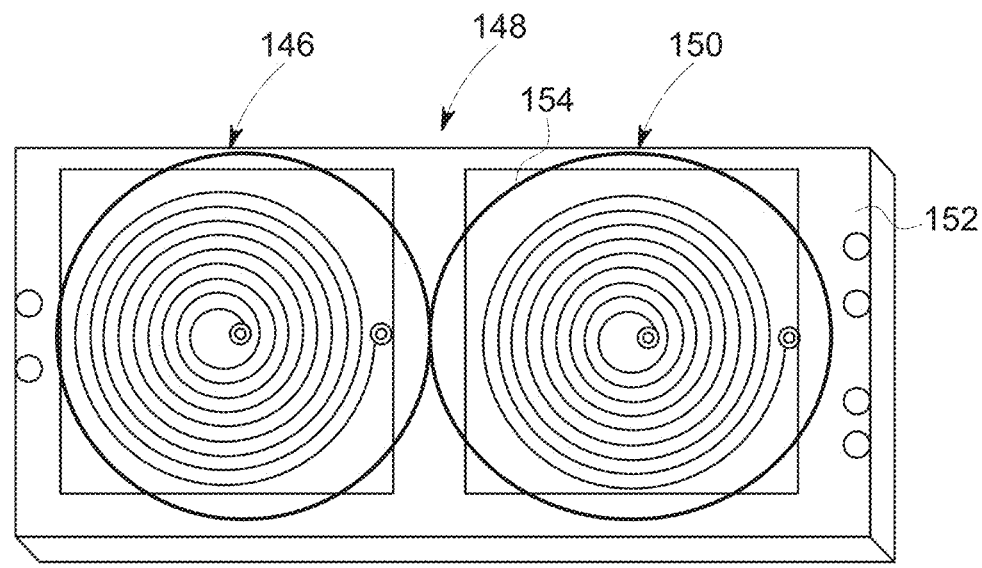
FIG. 16 is a schematic diagram of an embodiment of an air core transformer with the windings (e.g., spiral shape) and interlink integrated into a printed circuit board.
Figure 17:
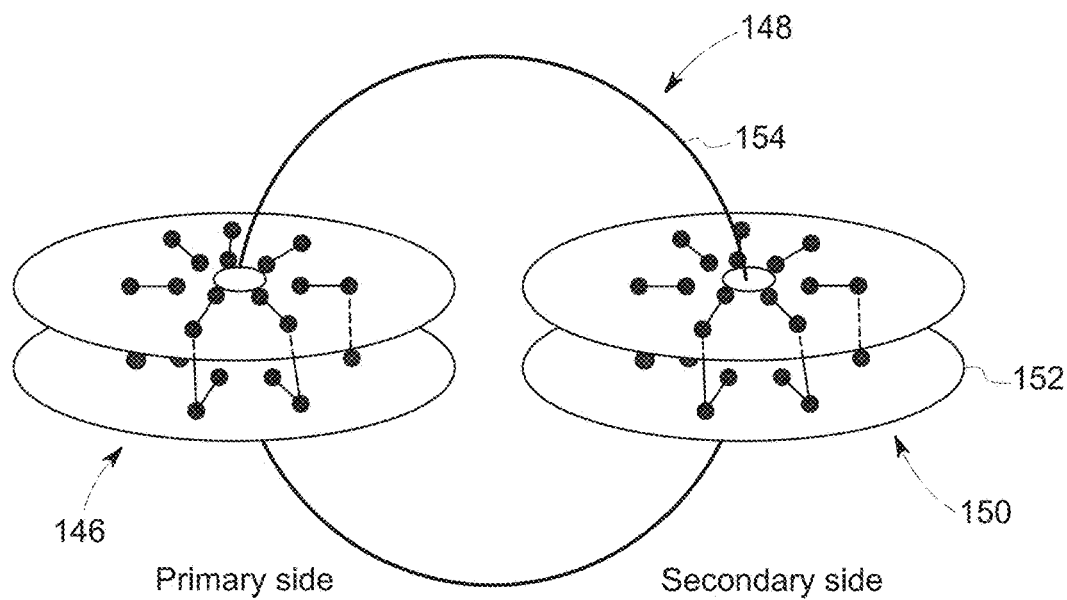
FIG. 17 is a schematic diagram of an embodiment of an air core transformer with the windings (e.g., toroidal shape) integrated into a printed circuit board.

In certain embodiments, components of the gate driver may be easily integrated into a printed circuit board (PCB). FIGS. 15 and 16 are schematic diagrams of a primary side 146 of an air core transformer 148 and the secondary side 150 integrated (e.g., printed) into or on a PCB 152, where the primary and secondary sides 146, 150 include spiral shaped windings. As depicted in FIG. 15, an interlink winding 154 linking the primary and secondary sides 146, 150 is discrete from the PCB 152. As depicted in FIG. 16, the interlink winding 154 is integrated (e.g., printed) in the PCB 152 and is crossed to increase coupling between the windings. FIG. 17 a schematic diagram of the air core transformer 148 with the windings (e.g., having a toroidal shape) of the primary and secondary sides 146, 150 integrated into the PCB 152. As depicted in FIG. 17, the interlink winding 154 is discrete from the PCB 152.

Figure 18:
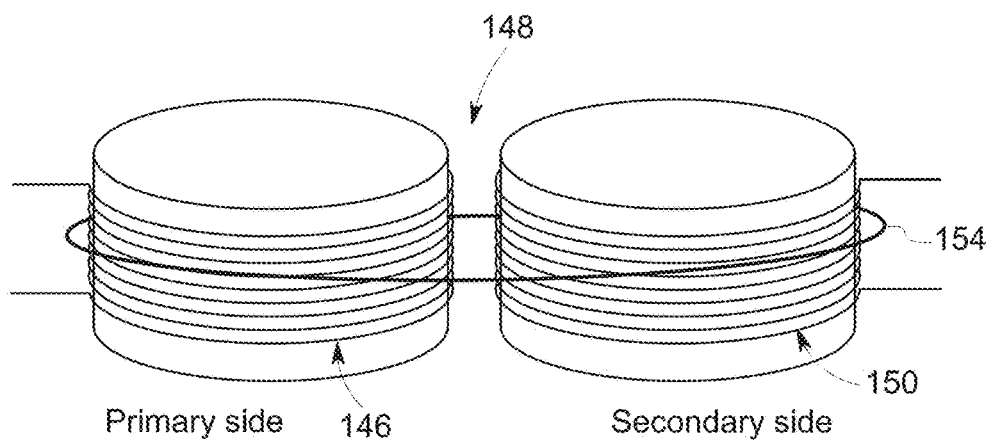
FIG. 18 is a schematic diagram of an embodiment of an air core transformer with cylindrical windings (e.g., having an uncrossed interlink winding or wire)
Figure 19:
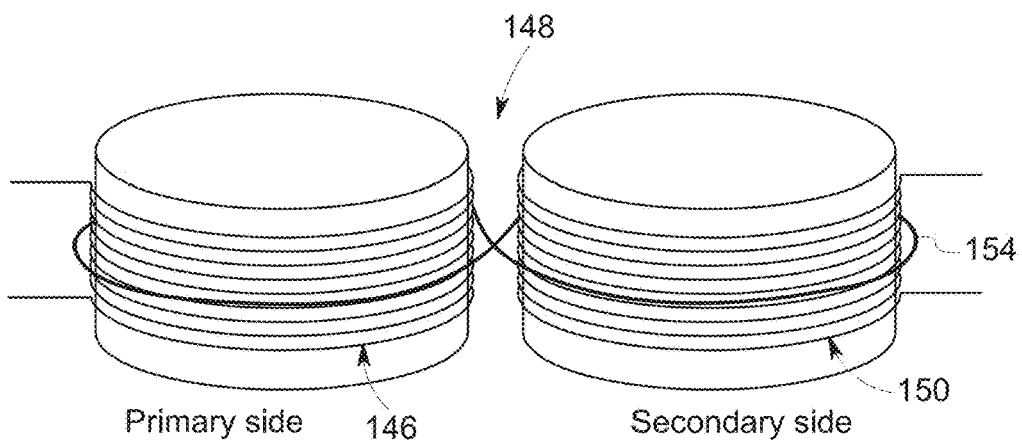
FIG. 19 is a schematic diagram of an embodiment of an air core transformer with cylindrical windings (e.g., having an crossed interlink winding or wire)
Figure 20:
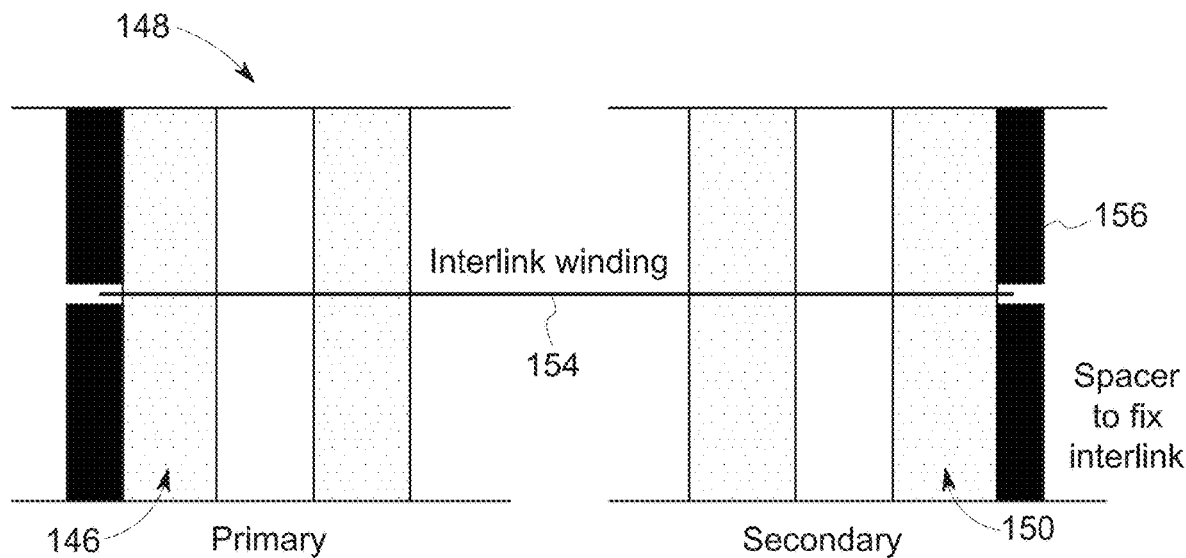
FIG. 20 is a schematic diagram of an embodiment of an air core transformer with cylindrical windings (e.g., having a spacer to fix interlink winding or wire)
Figure 21:
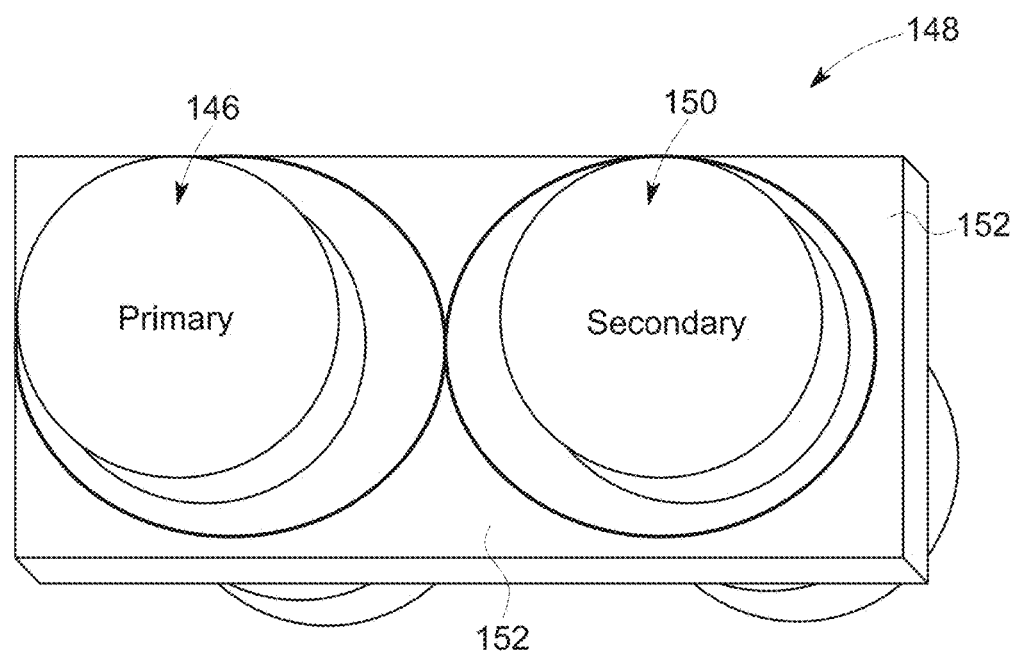
FIG. 21 is a schematic diagram of an embodiment of an air core transformer soldered to a printed circuit board (e.g., having interlink winding or wire integrated into the printed circuit board).

FIGS. 18-21 are schematic diagrams of the primary and second sides 146, 150 having cylindrical windings. The cylindrical windings of the primary and secondary sides 146, 150 may be disposed about plastic bobbins or any other structure that does not include ferromagnetic material. As depicted in FIG. 18, the interlink winding 154 disposed about the primary and secondary sides 146, 150 is not crossed. As depicted in FIG. 19, the interlink winding 154 is crossed to increase coupling between the cylindrical windings. In certain embodiments, as depicted in FIG. 20, a spacer 156 may be utilized to fix the interlink winding's position relative to the cylindrical windings. In certain embodiments, as depicted in FIG. 21, the primary and secondary sides 146, 150 may be soldered to the PCB 152, while the interlink winding 154 (e.g., a crossed interlink winding) is integrated into or on the PCB 152.

Technical effects of the disclosed embodiments include providing a gate driver that can be reliably and safely utilized in a scan room for a magnetic resonance imaging (MRI) system without affecting image quality. The gate driver includes an isolated gate driver power supply circuit that includes a coreless transformer (e.g., air core transformer). In certain embodiments, the isolated gate driver power supply circuit may include a resonance converter coupled to the coreless transformer to compensate for leakage inductance. In addition, the resonance converter tunes the transformer to enable the isolated gate driver power supply circuit to generate an output independent of load. The isolated gate driver power supply circuit may be more effective at reducing conducted and radiated interference due to soft switching and resonant operation with a stable and synchronized operation. Overall, the gate driver provides high power efficiency and load insensitivity at lower cost.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:
1. A gate driver circuit, comprising:
an isolated gate driver power supply circuit, comprising:
a coreless transformer comprising a primary winding and a secondary winding, wherein the primary winding and the secondary winding are linked by an interlink wire to reduce capacitance coupling between the primary winding and the secondary winding; and
a resonance converter coupled to the coreless transformer, wherein the resonance converter is configured to enable the isolated gate driver power supply circuit to generate an output voltage independent of load.

2. The gate driver circuit of claim 1, wherein the primary winding and the secondary winding are magnetically coupled together.

3. The gate driver circuit of claim 1, wherein the primary winding and the secondary winding are concentrically arranged with respect to each other.

4. The gate driver circuit of claim 3, wherein the resonance converter comprises a plurality of capacitors, and the plurality of capacitors comprises a first capacitor and a second capacitor respectively coupled to the primary winding and the secondary winding in series.

5. The gate driver circuit of claim 4, wherein the resonance converter is configured to compensate for leakage inductance of the coreless transformer.

6. The gate driver circuit of claim 1, wherein the resonance converter is configured to enable zero voltage switching by the isolated gate driver power supply circuit.

7. The gate driver circuit of claim 1, wherein the gate driver circuit is configured to be disposed and utilized within a scan room having a magnetic resonance imaging system.

8. The gate driver circuit of claim 1, wherein the isolated gate driver power supply circuit comprises a power source configured to provide power to the isolated gate driver power supply circuit, and a rectifier configured to provide a power output from the isolated gate driver power supply.

9. A gradient driver system for a magnetic resonance imaging (MM) system, comprising:
a gate driver circuit, comprising:
an isolated gate driver power supply circuit, comprising:
an air core transformer comprising a primary winding and a secondary winding, wherein the primary winding and the secondary winding are linked by an interlink wire to reduce capacitance coupling between the primary winding and the secondary winding; and
a resonance converter coupled to the air core transformer, wherein the resonance converter is configured to compensate for leakage inductance of the air core transformer, and wherein the resonance converter is configured to enable the isolated gate driver power supply circuit to generate an output voltage independent of load.

10. The gradient driver system of claim 9, wherein the primary winding and the secondary winding are magnetically coupled together.

11. The gradient driver system of claim 10, wherein the primary winding and the secondary winding are concentrically arranged with respect to each other.

12. The gradient driver system of claim 11, wherein the resonance converter comprises a plurality of capacitors, and the plurality of capacitors comprises a first capacitor and a second capacitor respectively coupled to the primary winding and the secondary winding in series.

13. The gradient driver system of claim 9, wherein the gate driver circuit is configured to be disposed and utilized within a scan room having the MM system.

14. The gradient driver system of claim 9, wherein the isolated gate driver power supply circuit comprises a power source configured to provide power to the isolated gate driver power supply circuit, and a rectifier configured to provide a power output from the isolated gate driver power supply.

15. A method of manufacturing an isolated gate driver power supply circuit for a gate driver circuit, comprising:
coupling a coreless transformer to a resonance converter, wherein the coreless transformer comprises a primary winding and a secondary winding, wherein the primary winding and the secondary winding are linked by an interlink wire to reduce capacitance coupling between the primary winding and the secondary winding, and wherein the resonance converter is configured to enable the isolated gate driver power supply circuit to generate an output voltage independent of load;
coupling a power supply to the coreless transformer; and
coupling a rectifier to the resonance converter.

16. The method of claim 15, wherein the resonance converter comprises a first capacitor and a second capacitor, and coupling the coreless transformer to the resonance converter comprises coupling a first capacitor and a second capacitor respectively to the primary winding and the secondary winding in series.

17. The gate driver circuit of claim 1, wherein the interlink winding is crossed.

18. The gate driver circuit of claim 1, wherein the primary winding and the secondary winding are integrated into a printed circuit board (PCB).

19. The gate driver circuit of claim 1, wherein the interlink winding is integrated into a printed circuit board (PCB).

20. The gate driver circuit of claim 1, wherein a spacer fixes a position of the interlink winding relative to the primary winding and the secondary winding.

* * * * *